United States Patent [19]

Miyamura et al.

[11] Patent Number: 4,902,934
[45] Date of Patent: Feb. 20, 1990

[54] PLASMA APPARATUS

[75] Inventors: Tadashi Miyamura; Shigeo Sugawara, both of Osaka, Japan

[73] Assignee: Sumitomo Metal Industries, Ltd., Osaka, Japan

[21] Appl. No.: 192,130

[22] Filed: May 10, 1988

[51] Int. Cl.[4] .................. H01J 7/24; H05B 31/26; C23C 16/00
[52] U.S. Cl. ................. 315/111.21; 315/111.71; 118/728; 118/729; 118/715; 118/719; 250/492.2
[58] Field of Search .................. 315/111.01, 111.21, 315/111.31, 111.71; 313/231.31, 231/51; 250/492.2; 118/715, 716, 719, 724, 728, 729, 730

[56] References Cited

U.S. PATENT DOCUMENTS

| | | | |
|---|---|---|---|
| 4,550,239 | 10/1985 | Uehara et al. | 2150/492.21 |
| 4,641,060 | 2/1987 | Dandl | 315/111.21 |
| 4,668,365 | 5/1987 | Foster et al. | 118/728 |
| 4,713,585 | 12/1987 | Ohno et al. | 315/111.21 |
| 4,724,300 | 2/1988 | Dearnaley | 250/49.21 |

Primary Examiner—Eugene R. Laroche
Assistant Examiner—Michael B. Shingleton
Attorney, Agent, or Firm—Burns, Doane, Swecker & Mathis

[57] ABSTRACT

A plasma apparatus which is; provided with a pair of plasma generation chambers at both sides of a specimen chamber próvided therein with two specimen mounts for fixing specimens to be subjected to the predetermined processing such as plasma CVD; designed to use the specimen chamber in common so as to simultaneously process by plasma generated by the pair of plasma generation chambers the specimens fixed to the two specimen mounts to thereby be compact as a whole; and provided with a load lock chamber communicated with the specimen chamber and delivering the specimens between the load lock chamber and specimen chamber, so that the plurality of specimens are contained in cassettes disposed in the load lock chamber and the contained specimens are moved between the load lock chamber and the specimen chamber by means of a loader provided in the load lock chamber, thereby enabling a rest time to be reduced and the specimen to be efficiently processed.

5 Claims, 4 Drawing Sheets

PLASMA APPARATUS

BACKGROUND OF THE INVENTION

1. Field of the Invention

The present invention realtes to a plasma apparatus utilizing electron cyclotron resonance used as a CVD (chemical vapor deposition) apparatus, an etching apparatus, a sputtering apparatus or the like for manufacturing semiconductor equipments, and more particularly to a plasma apparatus using a specimen chamber in common with respect to two plasma generation chambers.

2. Description of the Prior Art

The plasma apparatus utilizing electron cyclotron resonance (to be hereinafter referred to as ECR) is advantageous in that plasma of high activity can be obtained under low gas pressure, the ion energy can widely be selected, a large ion current is obtained, and an ion flow is superior in directivity and uniformity, and has been promoted in research and development as the apparatus indispensable for manufacture of a high integrated semiconductor apparatus.

FIG. 1 is a longitudinally sectional view of the conventional plasma apparatus utilizing the ECR as the plasma CVD apparatus, in which a plasma generation chamber 31 is shown. The plasma generation chamber 31 is surrounded with double framed walls and provided therebetween with a cooling water flow chamber 31a, at the center of the upper wall with a microwave inlet 31c vacuum-sealed by a quartz glass plate 31b, and at the center of the lower wall with a plasma extraction window 31d opposite to the microwave inlet 31c. A wave guide 32 is connected at one end thereof with the microwave inlet 31c, a reaction chamber 33 as specimen chamber is provided and faces the plasma extraction window 31d, and exciting coils 34 are disposed around and coaxially with the plasma generation chamber 31 and an end portion of the wave guide 32 connected thereto.

The waveguide 32 is connected at the other end thereof with a high frequency oscillator (not shown), in the reaction chamber 33 is disposed a specimen table 36 for a specimen S of a semiconductor wafer or the like opposite to the plasma extraction window 31d, and an evacuation port 33a communicating with an evacuation system 37 is open at a lower wall of the reaciton chamber 33. In addition, reference numerals 31e and 31f designate a supply system for cooling water and a drain system therefor respectively and 31g designates a gas supply system.

In such plasma CVD apparatus, the specimen S is placed on the specimen table 36, gas is introduced into the plasma generation chamber 31 through a primary gas supply system 31g, D.C. voltage is applied to the exciting coils 34, and microwave power is introduced into the plasma chamber 321 through the wavguide 32, so that plasma is generated in the plasma generation chamber 31. The generated plasma is incident on the specimen S in the reaction chamber 33 by means of a divergent magnetic field generated by the exciting coils 34 and lowered of the magnetic flux density from the plasma extraction window 31d toward the reaction chamber 33 thereunder, thereby plasma-decomposing the gas in the reaction chamber 33 to form a semiconductor film or the like on the surface of the specimen S.

When semiconductor films are formed on many specimens by such the apparatus respectively, the plasma apparatus of course increases in number corresponding to the number of specimens. As a result, the problem is created in that it is much useless in equipment to increase the plasma apparatus independently and an installation space is liable to be wasted.

SUMMARY OF THE INVENTION

In order to solve the above problem, the present invention has been designed.

A first object thereof is to provide a plasma apparatus which uses a specimen chamber in common with respect to two plasma generation chambers so as to be compact as a whole.

A second object of the invention is to provide a plasma apparatus which disposes a load lock chamber communicating with the specimen chamber, contains specimens in cassettes disposed in the load lock chamber, and transports the specimens by transport means betweenthe load lock chamber and the specimen chamber, whereby a rest time is reducible and an efficient speciment processing is performable.

A third object of the invention is to provide a plasma apparatus which is provided at the load lock chamber with cassettes loading thereon a plurality of specimens so that the specimens together with the cassettes are taken in or out of the load lock chamber, thereby facilitating treatment of the specimen.

A fourth object of the invention is to provide a plasma apparatus which contains a plurality of specimens in the cassettes in the load lock chamber and processes them, whereby the number of times of gas supply and evacuation works with respect to the load lock chamber is largely reduced, a running cost is expected to be lower, and the work efficiency is improved.

The above and further objects and features of the invention will more fully be apparent from the following detailed description with accompanying drawings.

DESCRIPTION OF THE PREFERRED EMBODIMENT

Next, an embodiment of a plasma apparatus of the invention as a plasma CVD apparatus will be detailed in accordance with the drawings.

Figure 1:
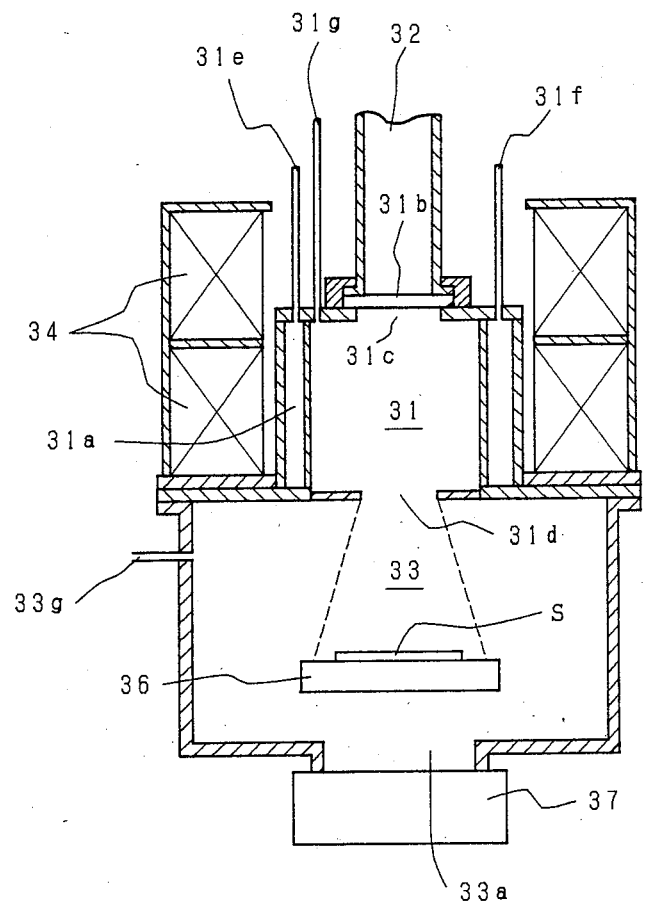
FIG. 1 is a longitudinally sectional view of the convention plasma apparatus.
Figure 2:
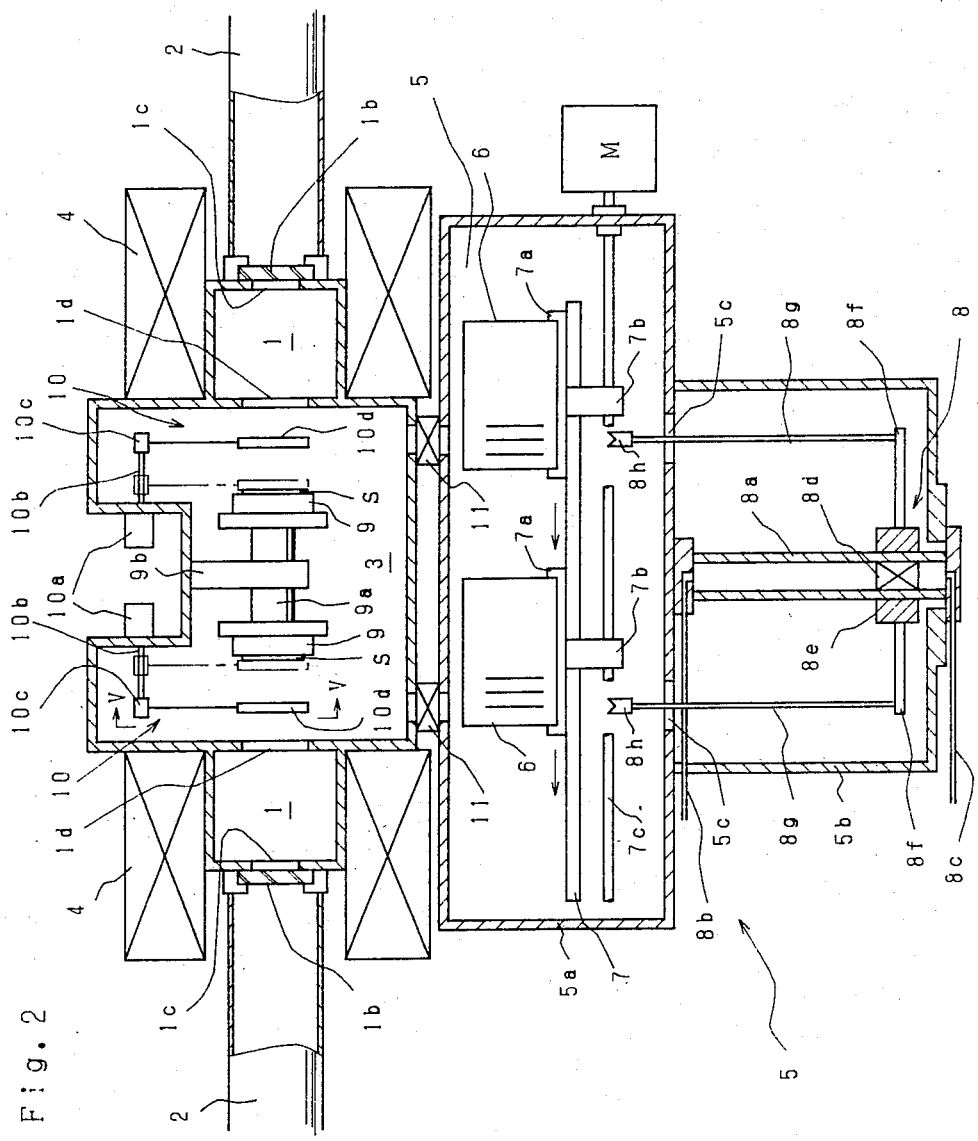
FIG. 2 is a longitudinally sectional view of an embodiment of a plasma apparatus of the present invention.

Referring to FIG. 2, reference numeral 1, 1 designate plasma generation chambers, 2, 2 designate waveguides, 3 designates a reaction chamber as a specimen chamber for applying a film on a specimen, 4, 4 designate exicting coils, and 5 designates a lod lock chamber.

The plasma generation chambers 1, 1 are cylindrical, spaced at a predetermined interval from each other, with the axis thereof being horizontal and in alingment with each other. The reaction chamber 3 as the specimen chamber in common to both the plasma generation chambers 1, 1 is provided therebetween, and under the plasma generation chambers 1, 1 and reaction chamber 3 is provided a load lock chamber 5 connected with the reaction chamber 3 through two communicating conduits for communicating or cutting off into air-tight condition by operating gate valves 11, 11.

Microwave inlets 1c, 1c sealed by quartz glass plates 1b, 1b are provided at the centers of outside walls of the plasma generation chambers 1, 1 respectively and plasma extraction windows 1d, 1d are open at the centers of the inside walls of the same and opposite to each other across the reaction chamber 3 respectively. The microwave inlets 1c, 1c connect with one ends of the waveguides 2, 2, the exciting coils 4, 4 being provided coaxially around the plasma generation chambers 1, 1 and the end portions of the waveguides 2, 2 connected thereto respectively.

The waveguides 2, 2 are connected at the other ends to high frequency oscillators (not shown) so that the microwaves generated therefrom are introduced into the respective plasma generation chambers 1, 1 through the waveguides 2, 2 and microwave inlets 1c, 1c.

The exciting coils 4, 4 disposed as above-mentioned are positioned coaxially with the plasma generation chambers 1, 1 and waveguides 2, 2 and in alignment with each other and connected to a D.C. power source (not shown), so that the magnetic field is generated by introducing the microwave into each of the plasma generation chambers 1, 1 so as to generate plasma, and the divergent magnetic field lowering its magnetic flux density toward the reaction chamber 3 is produced in each of the plasma generation chambers 1, 1, whereby the plasma is incident to the reaction chamber 3.

On the other hand, in the reaction chamber 3 are disposed a pair of specimen mounts 9, 9 and clamps 10, 10 consituting a first transport means, and at the load lock chamber 5, cassettes 6, 6 are disposed in a housing 5a, and a loader 8 constituting second transport means is disposed in a housing 5b.

Figure 3:
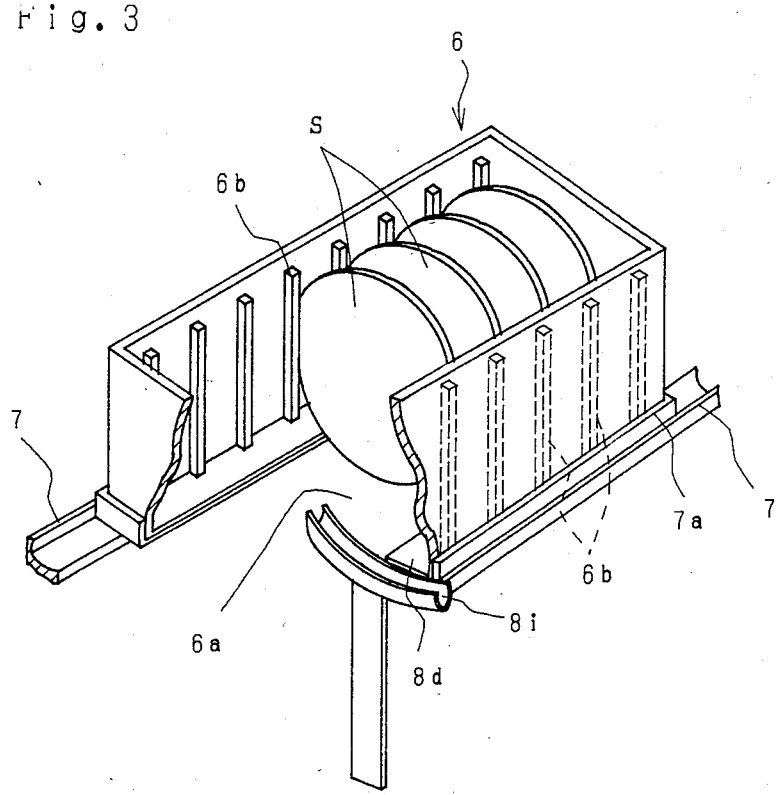
FIG. 3 is a partially cutaway view of a cassette.

Each of the cassettes 6, 6, as shown in FIG. 3, is open upwardly and has at the bottom an opening extending lengthwise of the cassette 6 and having a width smaller than a diameter of the speciment S, thereby being formed in a hollow rectangular parallelpiped provided with an insertion bore 6a through which each of the holders 8h, 8h of the loader 8 is passable. At the left and right side plates of each of the cassettes 6, 6 are provided a plurality of partition ribs 6b, 6b, . . . extending vertcially, opposite to each other, and spaced at predetermined intervals lengthwise of the side plates, so that the specimens S, S, . . . are housed one by one in the intervals between the adjacent partition ribs 6b, 6b . . . Each of the cassettes 6, 6 is placed on each guide tables 7a, 7a on a guide rail 7 disposed in the cassette housing 5a and extending lengthwise thereof, each of the guide tables 7a, 7a engaging with a screw rod 7c by a ball screw through each of the connecting rods 7b, 7b. Hence, each of the table 7a, 7a in turn, each of the cassettes 6, 6 is driven by a motor M provided at one end of the screw rod 7c and moved one by one pitch corresponding to the interval between the respective specimens S, S contained in each of the cassettes 6, 6, thereby being positioned opposite to each of the holder 8h, 8h of the loader 8.

The loader 8 is so constructed that a cylinder 8a erected at the center of the housing 5b connects at the upper and lower ends with air supply and exhaust pipers 8b and 8c respectively, the cylinder 8a being provided therein with a piston 8d of magnet and at the outer surface with blocks 8e carrying the holders 8h, 8h and slibably mounted on the cylinder 8a. Air is supplied or exhausted into or out of the cylinder 8a through the air supply and exhaust pipes 8b and 8c, whereby the piston 8d, in turn the block 8e magnetically attracted thereto, are vertically moved to move vertically between the housing 5a at the load lock chamber 5 and the reaction chamber 3 the holders 8h, 8h supported to the block 8e through support rods 8f, 8f and support bars 8g, 8g respectively.

Figure 4:
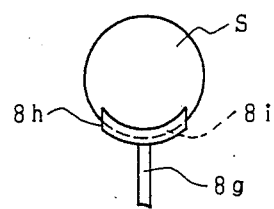
FIG. 4 is a side view showing the state where a specimen is held by a holder of a loader.

Each of the holders 8h, 8h, as shown in FIGS. 3 and 4, is formed on the upper end of each of the support bars 8g, 8g, of a length somewhat smaller than a diameter of each specimen S, and provided with a groove 8i of a circular arc and about equal in the size to the edge of each speciment S. The holders 8h, 8h, when moved upwardly through the cassettes 6, 6 due to the rising of the block 8e, hold the specimen S fitted at the lower edges into the grooves 8i, 8i and rise through the gate valves 11, 11 to the position in the reaction chamber 3 where the specimens S are delivered to the clamps 10, 10 as the first transfer means. On the contrary, the holders 8h, 8h receive the specimens S from the clamps, 10, 10 and return the same to the cassettes 6, 6 on the way downward.

Each specimen mounts 9 is formed in a disk larger in diameter than the specimen S, fixed at the center of the rear surface thereof to both lengthwise ends of a rod 9a, and supported to the upper wall of the reaction chamber 3 through a support 9b in relation of being opposite to the plasma extraction window 1d at each plasma generation chamber 1, the specimen S being adapted to be electrostatically attracted (alternatively it may be fixed by mechanical means) to the front surface of each specimen mount 9. Each of the specimen mounts 9, 9 is provided with cooling and heating means for the specimen S and adapted to be moved toward or away from each plasma extraction window 1d by expanding or contracting the rod 9a.

Figure 5:
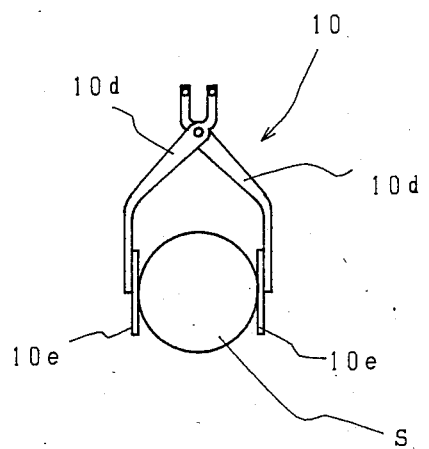
FIG. 5 is a partially side view taken on the line V—V in FIG. 2.

The clamps 10, 10 constituting the first transport means, as shown i FIGS. 2 and 5, each of them is so constructed that each rod 10b of each air 10a cylinder 10a fixed to the outer surface of the wall of the reaction chamber 3 projects thereinto and an acutator 10c is attached to the utmost end of the rod 10b, so that each air cylinder operates to move each clamp arm 10d in reciprocation between the delivery position of specimen S shown by the solid line in FIG. 2 and that shown by the one-dot chain line in respect to each of the specimen mounts 9, 9 in the same drawing. The actuators 10c, 10c open or close the clamp arms 10d, 10d at the respective positions, and the clamp arms 10d, 10d grip the specimens S through elastic materials 10e, 10e or release it, thereby delivering the specimens S between the respective the holders 8h, 8h of the loader 8 and specimen mounts 9, 9 respectively.

In the plasma apparatus of the invention constructed as above-mentioned, the gate valves 11, 11 are closed, gas is supplied into the load lock chamber 5 from the feed and evacuation system therein (not shown) so as to approximately equalize the gas pressure with the atmospheric pressure, thereafter the exchange port is open to draw out cassettes 6, 6, and new cassettes 6, 6 are loaded on the guided tables 7a, 7a which are put on the guide rail 7.

The exchange port is closed and the gas is evacuated through the evacuation system (not shown) so that the inside of the load lock chamber 5 is set to a predetermined degree of vacuum about equal to that in the reaction chamber 3, and thereafter the gate valves 11, 11 are set to be open and the loader 8 is actuated. In other words, air is supplied into the cylinder 8a from the lower end thereof and exhausted through the upper end so as to raise the piston 8d, blocks 8e and holders 8h, 8h coupled therewith, the holders 8h, 8h are inserted into the cassettes 6, 6 through the insertion bores 6a, 6a at the bottoms respectively, the specimens S, while being fitted at the lower edges into the grooves 8i, 8i, are picked up from the cassettes 6, 6 and raised to the delivery positions in the reaction chamber 3 respectively through the communication conducits and then stop. At the delivery positions, the clamps 10, 10 as first transport means are stand-by while keeping both the clamp arms 10d, 10d open, so that, when the loader 8 stops its rise, the actuators 10c, 10c operate to close the respective clamp arms 10d, 10d and the elastic members 10e, 10e, as shown in FIG. 4, clamp therebetween the specimen S. Then, the loader 8 lowers and returns to the original position and the gate valves 11, 11 are closed. Also, the clamps 10, 10 move toward the respective specimen mounts 9, 9 the specimen S is electrostatically attracted thereto, and the respective clamp arms 10d, 10d are released to return to the original position for stand-by.

Gas is supplied into the plasma generation chamber 1, 1 through the gas supply system (not shown), a D.C. current is flowed in the exicting coils 4, 4, microwave is introduced into the plasma generation chambers 1, 1 through the waveguide 2, 2 to generate plasma, the generated plasma is incident around the specimen S in the reaction chamber 3 by means of the divergent magnetic field generated by the exciting coils 4, 4, and the source gas, for example, $SiH_4$, $O_2$ or $N_2$, supplied from the gas supply system (not shown) is plasma-decomposed, thereby applying on the surface of specimen S a film of $SiO_2$, $Si_3N_4$ or the like.

When the film formation is completed, the clamps 10, 10 move close to the respective front surfaces of specimen mounts 9, 9 and close the clamp arms 10d, 10d to hold the specimens S thereby and then moves forward to the delivery position. Simultaneously, the gate valves 11, 11 are open, the loader 8 again rises to the position where the specimen S at the lower edge is fitted into the groove 8i at the holder 8h, then the clamp arms 10d, 10d are released, and the specimen S is transferred to the loader 8. Thus, the loader 8 lowers to the original position and the film-applied specimen is returned into the respective cassettes 6, 6.

The pitch feeding motor M is driven to move the cassettes 6, 6 in the direction of the arrow so as to load the next specimens S on the holders 8h, 8h, the loader 8 again rises to pick up the specimens S from the cassettes 6, 6 and further rises to the delivery position in the reaction chamber 3 to deliver the specimens S to the clamps 10, 10 respectively.

Thereafter, the aforesaid operation is repeated. Upon completing the film formation with respect to all the specimens S in the cassettes 6, 6, gas is charged into the load lock chamber 5 from the gas supply system (not shown) and pressurized up to the atmospheric pressure. Thereafter, the exchange port is open to renew the cassettes 6, 6 and then closed to reduce the internal pressure of the load lock chamber 5 to a predetermined pressure, and thereafter the aforesaid work is repeated.

In addition, although the embodiment applies the invention to the CVD apparatus, the invention is not limited thereto, but of course applicable to, for example, an etching apparatus or a sputtering apparatus.

As seen from the above, the plasma apparatus of the invention uses only one specimen chamber to be compact, can process simultaneously two specimens so as to raise the process efficiency, houses a plurality of specimens in the load lock chamber and completes the processing of them, and thereafter takes the specimens together with the cassettes from or into the load lock chamber, thereby facilitating handling of the specimens, largely reducing the gas supply and exhaust works with respect to the load lock chamber, saving a running cost, and improving the work efficiency.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metts and bounds of the claims, or equivalence of such meets and bound thereof are therefore intended to be embraced by the claims.

What is claimed is:

1. A plasma apparatus comprising;
    a pair of plasma generation chambers for generating plasma by electron cyclotron resonance excitation utilizing microwaves;
    a specimen chamber being provided at both sides thereof with said plasma generation chambers opposite to each other and at the facing positions at both side walls thereof with plasma extraction windows facing said plasma generation chambers; and
    a pair of specimen mounts disposed in said specimen chamber, oriented reversely to each other, and opposite to said plasma extraction windows respectively.

2. A plasma apparatus as set forth in claim 1, further comprising a load lock chmber communicating with said specimen chamber through communicating conduits provided at one side wall of said specimen chamber not-opposite to said plasma extraction windows thereat and being provided therein with means for containing therein a plurality of specimens to be supplied to each of said specimen mounts.

3. A plasma apparatus as set forth in claim 2, wherein said specimen chamber comprises a first transport means for holding said specimen supplied from said load lock chamber and transporting said specimen to each of said specimen mounts.

4. A plasma apparatus as set forth in claim 1, wherein each of said specimen mounts comprises holding means for fixing said specimen by electrostatic attraction, cooling means for cooling said speciment by use of cooling water, and heating means for heating said specimen.

5. A plasma apparatus as set forth in claim 3, wherein said load lock chamber comprises a pair of cassettes containing therein said plurality of specimens and corresponding to said pair of specimen mounts respectively, a moving means for simultaneously moving each of said cassettes at every interval of said contained specimens, and a second transport means for delivering said specimen between each of said cassettes and said first transport means.

* * * * *